US005577236A

United States Patent [19]

Johnson et al.

[11] Patent Number: 5,577,236

[45] Date of Patent: Nov. 19, 1996

[54] MEMORY CONTROLLER FOR READING DATA FROM SYNCHRONOUS RAM

[75] Inventors: Mark C. Johnson, San Jose; Donald J. Lang, Cupertino, both of Calif.; Sudha Sarma; Forrest L. Wade, both of Tucson, Ariz.; Adalberto G. Yanes, Sunnyvale, Calif.

[73] Assignee: International Business Machines Corporation, Armonk, N.Y.

[21] Appl. No.: 367,514

[22] Filed: Dec. 30, 1994

[51] Int. Cl.[6] .................... G06F 12/00

[52] U.S. Cl. .................... 395/551; 395/405

[58] Field of Search .................... 395/405, 431, 395/432, 494, 550

[56] References Cited

U.S. PATENT DOCUMENTS

| | | | |
|---|---|---|---|
| 4,691,302 | 9/1987 | Mattausch | 365/240 |
| 4,734,888 | 3/1988 | Tielert | 365/194 |
| 4,740,924 | 4/1988 | Tielert | 365/194 |
| 5,077,693 | 12/1991 | Hardee et al. | 365/230.08 |
| 5,179,667 | 1/1993 | Iyer | 395/275 |
| 5,193,165 | 3/1993 | Eikill et al. | 395/425 |
| 5,193,193 | 3/1993 | Iyer | 395/725 |
| 5,253,357 | 10/1993 | Allen et al. | 395/425 |
| 5,260,892 | 11/1993 | Testa | 365/63 |
| 5,265,218 | 11/1993 | Testa et al. | 395/325 |
| 5,270,964 | 12/1993 | Bechtolsheim et al. | 365/52 |
| 5,272,664 | 12/1993 | Alexander et al. | 365/52 |
| 5,276,858 | 1/1994 | Oak et al. | 395/550 |
| 5,278,967 | 1/1984 | Curran | 395/425 |
| 5,283,877 | 2/1994 | Gastinel et al. | 395/425 |
| 5,287,327 | 2/1994 | Takasugi | 365/230.02 |
| 5,301,278 | 4/1994 | Bowater et al. | 395/275 |
| 5,311,483 | 5/1994 | Takasugi | 365/233 |

FOREIGN PATENT DOCUMENTS

| | | | |
|---|---|---|---|
| 0549139A1 | 6/1993 | European Pat. Off. | G06F 13/42 |

OTHER PUBLICATIONS

IBM Technical Disclosure Bulletin, vol. 31, No. 9, Feb. 1989, entitled "Programmable Memory Controller".

IBM Technical Disclosure Bulletin, vol. 33, No. 6A, Nov. 1990, entitled "Self-Configuring Lookup-Table-Controller Dram Memory Controller".

IBM Technical Disclosure Bulletin, vol. 33, No. 6A, Nov. 1990, entitled "Optimum Timing Auto-Configurable Micro-coded Memory Controller".

*Primary Examiner*—Thomas M. Heckler
*Attorney, Agent, or Firm*—Baker, Maxham, Jester & Meador

[57] ABSTRACT

A memory controller reads data from a memory bank of synchronous RAM during a small and variable data valid window, by compensating for delays in receiving the data caused by memory loading, chip and card manufacturing process variations, and the like. The memory controller includes a system clock driver to supply the memory bank with a clock reference signal. A sampling clock provides an assortment of sampling clock signals duplicative of the system clock signal, with various delays. A command driver initiates Read operations in the memory bank by relaying Read command signals to the memory bank. In response to the level of memory loading, such as the number of memory modules present in the memory bank, a clock selector directs a selected one of the sampling clock signals to a delay module, which replicates any delay the system clock driver may have. If desired, an additional, user-selectable supplementary delay unit may be used to increase the delay provided by the delay module, thereby increasing or offsetting the delay of the selected sampling clock signal. The delay module provides a delayed clock signal to synchronize receipt of Read data signals from the memory bank at a clocked latch, enabling the latch to receive the Read data signals during the appropriate data valid window. Specifically, the latch is activated by receipt of Read command signals, which may be coordinated, for example, with the rising edge of the delayed clock signal. The latched Read data signals are then available for use by other logic circuitry.

23 Claims, 4 Drawing Sheets

MEMORY CONTROLLER FOR READING DATA FROM SYNCHRONOUS RAM

BACKGROUND OF THE INVENTION

1. Field of the Invention

The present invention generally relates to the reading and writing of data to and from computer memory such as random access memory ("RAM"). More specifically, the invention concerns a timing system for implementing multiple synchronous RAM chips with improved efficiency.

2. Description of the Related Art

DEVELOPMENT AND OPERATION OF SYNCHRONOUS RAM

As RAM speeds increase, memory system designers experience more difficulty in using the newly available speed, primarily due to difficulties in generating the necessary timing signals. This is particularly true of page mode cycle times (i.e. where several column addresses are sequentially provided for a single row address).

Traditionally, RAM is "asynchronous", meaning that it operates at a clock rate independent of the clock used by the system processor. In a typical environment, the processor reads or writes data to the RAM by sending addresses and control signals to the RAM. Then, the processor waits for the appropriate delay time for the RAM to perform the requested action; this is called the RAM's "access time." With Dynamic RAM ("DRAM"), for example, the delay is needed for the DRAM to perform tasks such as activating word and bit lines, sensing data, and routing data to output buffers.

A number of techniques have been used to speed up the operation of RAM. For instance, "fast-access" modes, such as page, static-column, and nibble modes have been used to significantly increase RAM performance. Features such as "enhanced RAM" and "RAM busses" have also been used.

One of the newest and most significant improvements in memory access speed is synchronous RAM. Synchronous RAM differs from non-synchronous RAM by operating under synchronization with a central clock, and employing a fast cache-memory to hold the most commonly used data. Where DRAM might supply data during alternate clock cycles in some applications, synchronous DRAM ("S-DRAM") can supply data during successive clock signals. Hence, S-DRAM provides significantly increased memory "bandwidth", where memory "bandwidth" refers to the speed at which information can be exchanged with memory. Typically expressed in megabytes per second, memory bandwidth is a product of the rate of data transfer and the amount of data in each transfer operation. The memory bandwidth of S-DRAM may exceed 100 MHz. Synchronous SRAM ("S-SRAM") also provides improved memory bandwidth.

A typical implementation of S-DRAM is illustrated in FIG. 1. The S-DRAM includes a memory cell array 100, which is divided into columns and rows of memory bytes. An individual byte of the memory cell array 100 is accessed when an address decoder 102 selects a specific row address and column address of the desired memory location. The input to the address decoder 102 is a memory address, which it receives from a clocked address input unit 106. If desired, the address input may be multiplexed, enabling both the row and column addresses to be carried on the same signal lines. The selection of row and column addresses are controlled by a Row Address Strobe ("RAS") and a Column Address Strobe ("CAS"), respectively. The address decoder 102 decodes the row and column addresses it receives, and appropriately selects one or more memory cells in the memory cell array 100.

Data retrieved from the memory cell array 100 is provided to an output buffer 108 via a latch 110, under control of a clock signal provided by a user-supplied clock circuit 112. The user-supplied clock circuit 112 may also be used to clock the writing of data from an input buffer 111 into the memory cell array 100 via the latch 110, while memory addresses are being supplied by the address decoder 102. As determined by a read/write signal 113, the latch 110 may be responsive, in both read and write operations, to the clock signal's rising edge.

USE OF SINGLE IN-LINE MEMORY MODULES

Single In-Line Memory Modules ("SIMMs") are often used to implement RAM. A SIMM is a modular, compact circuit board designed to accommodate multiple surface-mount memory chips. SIMMs were developed to provide compact and easy-to-manage modular memory components for users to install in computer systems that are specifically designed to accept them. SIMMs are often used as a convenient means to expand the existing memory of a computer. SIMMs generally are easily inserted into a connector within the computer system, from which the SIMM derives all necessary power, ground, and logic signals.

A typical SIMM is illustrated in FIG. 2. The SIMM 200 includes multiple RAM chips 202 mounted to a printed circuit board 205. Connector contacts 206 of the board 205 are typically located on the lower edge 207 of the board 205. Depending on the user's needs, the RAM chips may comprise DRAM, SRAM, or Video RAM. Because DRAM memories are larger and cheaper than memory cells for SRAMs, DRAMs are widely used as the principal building blocks for main memories in computer systems. SRAM and VRAM SIMMs typically have more limited application for special purposes such as extremely fast cache memories and video frame buffers, respectively.

DRAWBACKS OF KNOWN SYNCHRONOUS RAM IMPLEMENTATIONS

Despite the improved bandwidth of synchronous RAM, it can still be difficult to implement. One of the most sensitive operations of a synchronous RAM circuit is the sampling of data on a Read cycle. Synchronous RAMs typically have a certain window of time where data read from the memory is valid. Data is ultimately read in response to a system clock which coordinates the timing of a Read command issued to the memory; the Read command is received in the form of RAS, CAS, clock, and memory address signals. Hence, some time after issuance of the Read command, the synchronous RAM makes the desired data available, and keeps it available for a certain period. This period is called the "data valid window," and its delay with respect to the system clock is called "skew."

Due to concerns with the data valid window, synchronous RAM can be difficult to implement. Specifically, changing the memory loading by reducing or increasing the number of SIMMs changes the skew of the data valid window. As a result, it is difficult for a single memory controller to successfully read data from a bank of synchronous RAM that may change in size from time to time. For example, if more SIMMs are added, the memory controller will have to account for the increased skew in order to successfully read data at the appropriate time.

Data skew is influenced by a number of factors. One of these is "speed sort". Even though synchronous RAM chips and ASIC memory control chips are mass-produced using sophisticated machinery, some chips simply operate significantly faster than others due to "process variations", i.e. slight variations in the manner and/or materials used in the process of manufacturing the chips. The total data path involved in accessing RAM Read data includes delays introduced by a number of different features, such as the internal output logic path and the chip driver of the ASIC memory control chip, the "net", the RAM logic, the RAM data access time, the data return net, the ASIC chip receiver, and the internal chip input path logic to the receiver latch. With ASIC memory control chips, process variations affect the signal delay of all input and output signals to and from the chip, and have the effect of creating "fast" chips and "slow" chips, called "fast speed sort" and "slow speed sort", respectively. The total delay path exhibited by a fast ASIC chip, then, is significantly less than the total delay path of a slow chip. As a result, ASIC memory chips of the same make and model, operating with identical clock frequencies, may complete operations at different speeds. Accordingly, data skew can be significantly affected by process variations in the ASIC memory control chip, resulting in different levels of speed sorts. The same is true for RAM chips. However, RAM chips are typically sold with detailed timing specifications, which assist designers in accounting for the level of speed sort exhibited by that RAM.

Another factor that affects data skew is the number of memory chips placed on a bus, called the "load". Increasing the load placed on a memory bus usually delays the data valid window of those memory circuits due to the added capacitance. Specifically, as more RAM modules are added in the memory system, more and more capacitance is placed on the data bus. As is known, the increased capacitance increases the access time of the RAM. In many cases, a load of four to eight SIMMs can be problematic in this respect.

Data skew, then, can be increased by various factors. Moreover, problems with data skew breed problems with the data valid window. In particular, to successfully read data from synchronous RAM, one must use a "worst case" data valid window. As the possibility of substantial skew arises, the worst case data valid window narrows. And, with a narrower window for reading data, the accessibility and hence the efficiency of the memory is reduced, thereby defeating some of the very reasons to use synchronous RAM in the first place.

SUMMARY OF THE INVENTION

In accordance with the present invention, a memory controller is provided to read data from a memory bank: of synchronous RAM modules, whether the memory loading is light or heavy. In an illustrative embodiment of the invention, a memory controller includes a system clock used to clock the operation of the memory bank by providing a clock reference signal to the memory bank via a system clock driver. Upon receipt of Read command signals, a command driver initiates the reading of data from the memory bank. A latch is ultimately used to accept data read from the memory bank.

The system clock, however, is inadequate to clock the latch because the timing of data output by the memory bank may be delayed due to a number of factors, such as memory loading, delays introduced by the system clock driver, and other factors. Hence, data provided by the memory bank may only be obtained during a specific data valid window of time. Accordingly, the present invention provides a method and apparatus for delayed clocking of the latch to accept data from the memory bank during the data valid window.

To generate the delayed clock signal, a sampling clock provides an assortment of phase-shifted clock signals based upon the system clock signal. In response to the level of memory loading, a clock selector selects one of the sampling clock signals with an appropriate delay. The selected sampling clock signal is directed to a delay module, which further delays the sampling clock signal. The delay module includes a second clock driver to introduce a delay intended to duplicate any delay that the system clock driver exhibits in providing the clock reference signal to the memory bank. If the memory controller is implemented in an applications specific integrated circuit ("ASIC"), the second clock driver automatically accounts for any variations in the process of manufacturing the memory controller, since the system clock driver and the second clock driver are constructed on the same chip using identical components. The delay module may also include a supplementary delay unit, to add any additional delay that might be necessary to fine tune the delayed clock signal fed to the latch. Where the memory controller is implemented in an ASIC, the supplementary delay unit, for example, may comprise an off-chip component such as a fixed value delay circuit or a selected length of etched signal line.

In response to receipt of read command signals, the latch is triggered to accept data read from the memory bank. And, the delayed clock signal provides an appropriate timing signal for the latch to accept data from the memory bank during the data valid window.

The invention affords a number of distinct advantages. Chiefly, the invention provides an adaptable memory controller that can be used to manage the operation of a variety of different memory configurations, despite potentially substantial variations in loading when the amount of memory is increased or decreased. The invention avoids reductions in the data valid window when reading data from synchronous RAM units, thereby maintaining the maximum possible memory bandwidth. The memory controller can be adjusted to accommodate for increases or decreases in the number of SIMMs, without requiring any hardware modifications. Hence, the memory controller of the invention may easily be implemented in the form of an ASIC.

Furthermore, if the memory controller of the invention is implemented in an ASIC, it automatically compensates for its own process variations. Specifically, the second clock driver of the delay module accounts for any delays introduced by the system clock driver, and the supplementary delay unit adds any further delays that might be needed.

Another advantageous feature of the invention that it can be implemented with a D-edge latch to sample Read data. This enhances the ability to sample and read data within the data valid window. Unlike level-sensitive latches, where a complete clock signal must be received during the data valid window, using a D-edge latch only requires that the clock edge be valid during the window. The invention, then, increases the possibility of receiving valid data during the narrowest data valid window, and hence the efficiency of the highest performing memory controller.

BRIEF DESCRIPTION OF THE DRAWINGS

The nature, objects, and advantages of the invention will become more apparent to those skilled in the art after considering the following detailed description in connection with the accompanying drawings, in which like reference numerals designate like parts throughout, wherein.

DETAILED DESCRIPTION OF THE PREFERRED EMBODIMENTS

Structure

Figure 1:
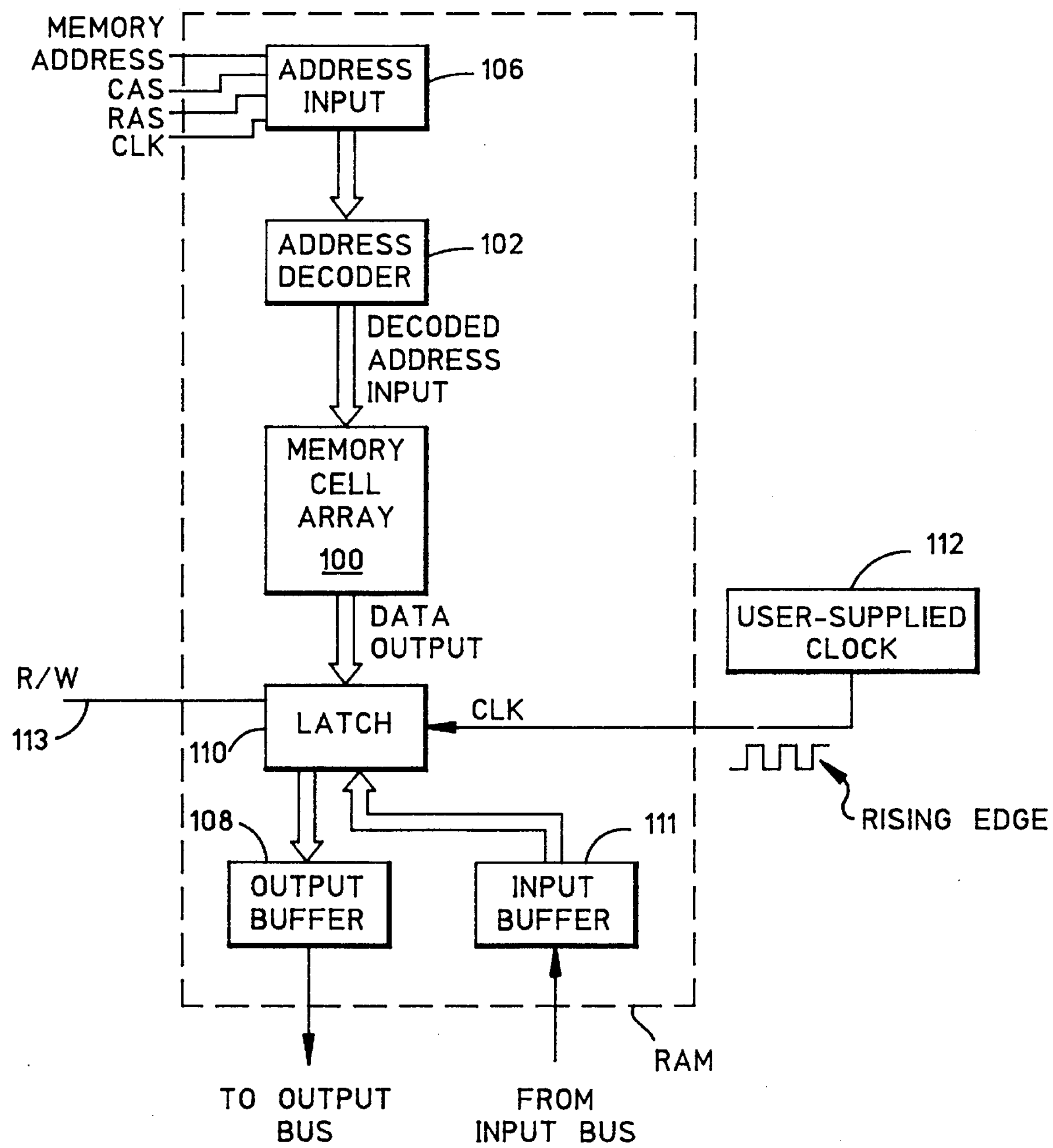
FIG. 1 is a block diagram illustrating a typical implementation of S-DRAM.
Figure 2:
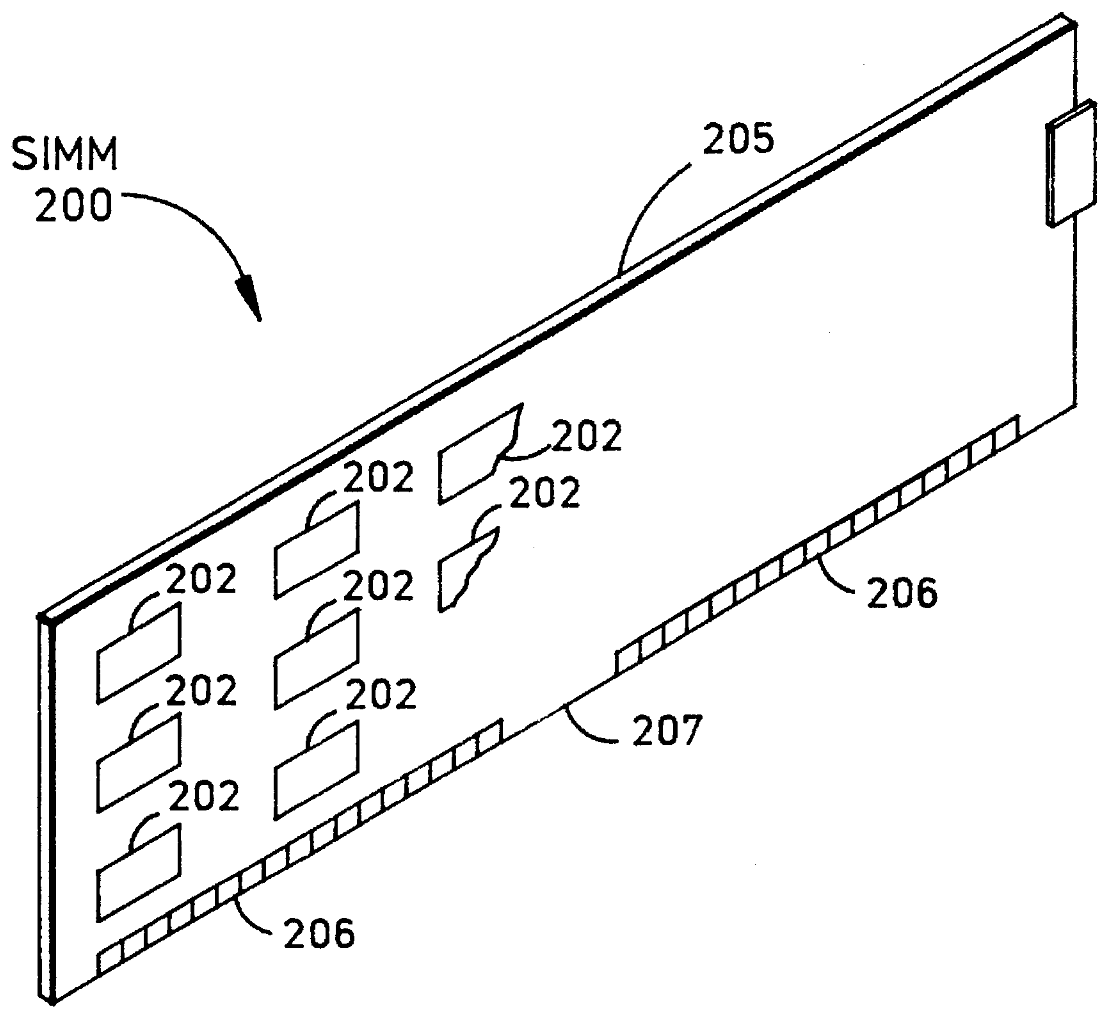
FIG. 2 is a perspective view of a typical SIMM 200.
Figure 3:
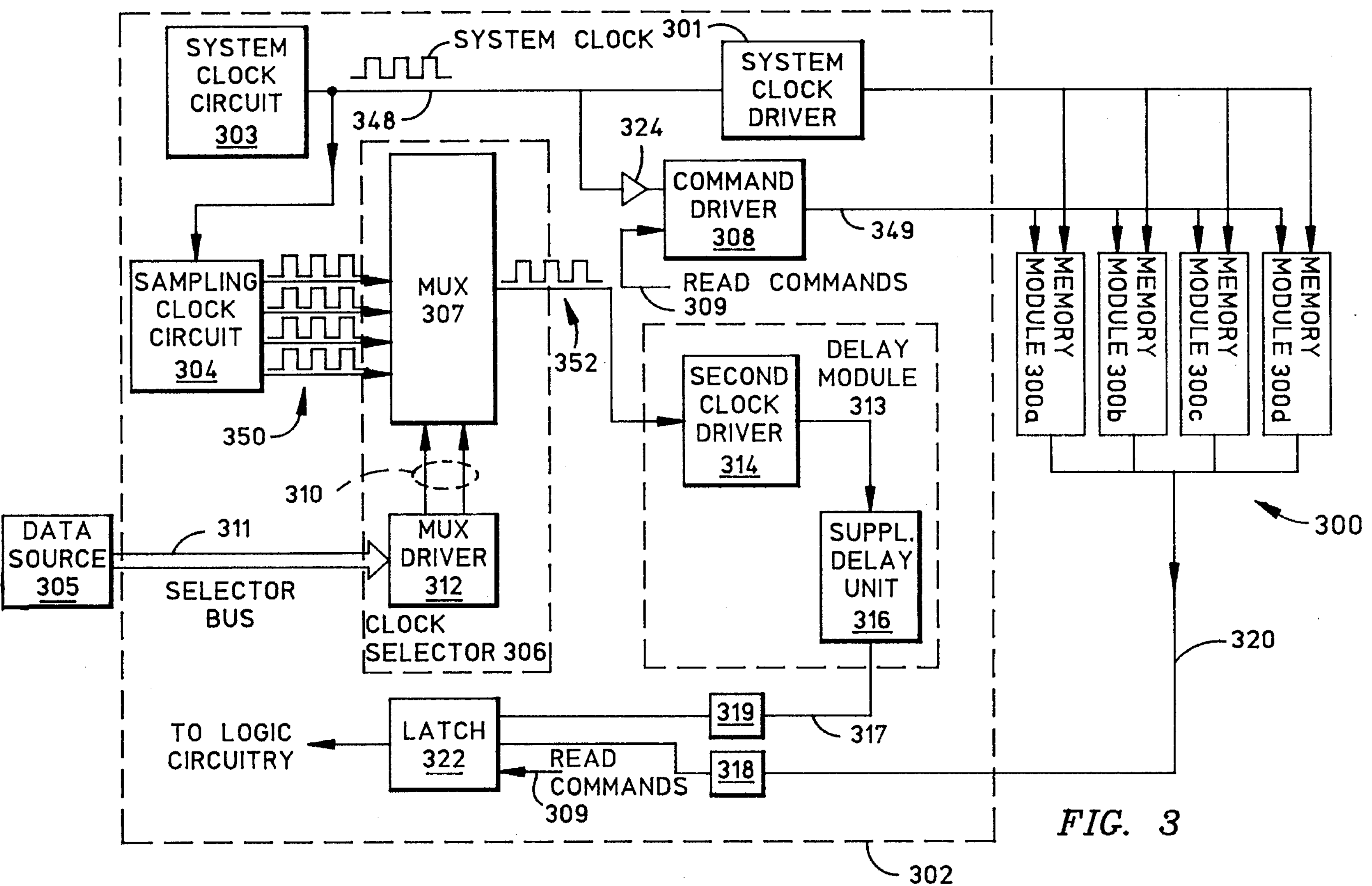
FIG. 3 is a block diagram illustrating use of a memory controller 302 to operate a memory bank 300 of memory modules 300*a*–300*d*, in accordance with the invention.

The present invention generally comprises a memory controller for coordinating access to synchronous memory such as S-DRAM and S-SRAM. FIG. 3 illustrates an illustrative implementation of the hardware components and interconnections of the invention, wherein a memory controller 302 manages access to a memory bank 300. The memory controller 302 is preferably implemented in an ASIC to reduce the circuit's size, decrease performance variations, and reduce the distance between circuit components. The memory bank 300 and memory controller 302 may be operated together for a variety of different applications. As an example, they may be operated to manage access to direct access storage devices ("DASDs") of a mainframe computer.

The memory bank 300 includes multiple memory modules 300*a*–300*d*, each of which may comprise a separate SIMM. In most cases, each memory module 300*a*–300*d* will utilize S-DRAM, since DRAM is significantly less expensive than SRAM and DRAM is presently used in the majority of RAM operations. In the exemplary embodiment, then, each memory module 300*a*–300*d* comprises a SIMM comprised of S-DRAM chips, such as NEC model PD45166421 S-DRAM integrated circuits. Although described in the context of S-DRAM, the memory controller of the invention is equally applicable to S-SRAM. For convenience and efficiency, the ASIC containing the memory controller may also include circuitry (not shown) for other purposes.

The memory controller 302 contains a number of different components. First, a system clock circuit 303 is provided to clock Read commands into the memory bank 300. The system clock circuit 303 provides a system clock signal on a signal line 348, which is connected to a system clock driver 301. The system clock driver 301 adds sufficient current to the low-current system clock signal to drive the higher-current requirements of the memory modules 300*a*–300*d*, thereby timing the internal operations of the modules 300*a*–300*d*. The system clock circuit 303 is also connected to an inverter 324, which is connected to a command driver 308 that serves to initiate operations in the memory bank 300 by coordinating the provision of Read commands to the memory bank 300. The output of the command driver 308 is provided to the modules 300*a*–300*d* via a command bus 349. The command driver 308 preferably comprises a latch (not shown) electrically connected in series to a signal-boosting driver (not shown), so that the driver 308 provides an output of the Read command signal in accordance with timing provided by the system clock signal. The command driver 308 includes an input 309 for receiving the Read command signals, which are conveyed to the memory bank 300; such Read commands may include, for example RAS, CAS, R/W, and memory address signals. In response to the Read command signals received on the input 309, the driver 308 functions to add sufficient current to the low-current Read command signals to drive the higher-current requirements of the memory modules 300*a*–300*d*.

The memory controller 302 also includes a sampling clock circuit 304 to coordinate the receipt of data read from the memory bank 300 during the appropriate data valid window, thus compensating for data skew. In particular, one of the sampling clock signals from the sampling clock circuit 304 is selectively fed to a delay module 313, which provides a delayed clock signal to a first receiver 319 via an output line 317, to synchronize the receipt by a latch 322 of Read data from the memory bank 300 during the appropriate data valid window.

More specifically, the sampling clock circuit 304 generates multiple sampling clock signals on signal lines 350, one signal of which is selectively directed to the delay module 313. The sampling clock circuit 304 may comprise, for example, an oscillator that provides signals resembling the system clock signal. The sampling clock signals on the signal lines 350 exhibit different phase characteristics (i.e. delays) with respect to each other, as described in greater detail below. The sampling clock signals are provided to a clock selector 306, which selectively directs an appropriate one of the sampling clock signals to the delay module 313. Selection of this clock signal is preferably accomplished automatically, as described in greater detail below. The clock selector 306 includes a multiplexer 307 ("mux") and a multiplexer driver 312 ("mux driver"). The mux driver 312 receives a signal indicative of the level of memory loading, i.e. the number of memory modules 300*a*–300*d* present. In response to this signal, the mux driver 312 provides an input signal on input lines 310 of the mux 307, causing the mux 307 to select one of the sampling clock signals on signal lines 350 and provide an output signal comprising the selected sampling clock signal on a line 352. As described in greater detail below, one of the sampling clock signals on the signal lines 350 may be chosen to exhibit the same timing characteristics as the system clock signal on the signal line 348, with the remaining clock signals of the lines 350 containing progressively greater and/or lesser delays of desired increments.

The sampling clock signal selected by the clock selector 306 is fed, via output line 352, to the delay module 313, which coordinates the timing of receiving Read from the memory bank 300. The delay module 313 includes a second clock driver 314, which is constructed from similar components as the system clock driver 301, and therefore provides the same delay as the driver 301. The delay module 313, if desired, may also include a supplementary delay unit 316. The supplementary delay unit 316 may be used to add further delay to the selected sampling clock signal, to more precisely coordinate the receipt of Read data from the modules 300*a*–300*d*. The supplementary delay unit 316, for example, may be used to add further delay to compensate for any delay introduced by circuitry such as the memory modules 300*a*–300*d* themselves. If the memory controller 302 is implemented in an ASIC, the delay unit 316 preferably comprises an "off-chip" device to provide added flexibility in adjusting the delay unit 316, and to ensure that the delay unit 316 is independent of any process variations experienced by the components of the ASIC. The delay unit 316 may include, for example, an etched signal line on a printed circuit board. In this embodiment, about six inches of signal line are added for each nanosecond ("nS") of delay that is needed.

Alternatively, a selected length of etched signal line may be used in series with a "fixed value delay circuit" (not shown) that provides a predetermined amount of delay. When a fixed value delay circuit receives an input signal, it provides an output of that input signal, delayed by specified delay value, such as 1 nS. Thus, where the supplementary delay unit 316 includes connections for receiving a fixed value delay circuit, the user of the invention can easily adjust the delay of the delay unit 316 by selecting and then inserting a fixed value delay circuit with the desired delay value. This selection is preferably made according to the level of memory loading, such as the number of SIMMs present in the memory bank 300. In an exemplary embodiment, the fixed value delay circuit of the invention may comprise a Technitrol brand "fixed value delay line", identical by one of the 53F2NNN series model numbers, which may be contained in a single in-line package.

The delayed clock signal provided by the delay module 313 on the line 317 is directed to the first receiver, which boosts the receiver signals to an appropriate level of current for the circuitry of the ASIC. A second receiver 318 is also provided, to receive Read data from the memory modules **300*a*–300*d* via a bus 320. The receiver 318 converts the received data signals to an appropriate current level for the circuitry of the ASIC. Specifically, in the act of reading data from the memory bank 300, the appropriate module 300*a*–300*d* places Read data onto the bus 320 in response to the Read command signals provided by the command driver 308 on the command bus 349, in accordance with the timing provided by the system clock circuit 303 via the system clock driver 301. Then, due to the selection of the appropriate sampling clock signal and the delays introduced by the delay module 313, the delayed clock signal provided on the line 317 enables the receiver 319 to present the appropriate clock signal to the latch 322 to latch the Read data received from the memory modules 300*a*–300*d***.

The latch 322 temporarily stores data provided by the second receiver 318 in accordance with timing provided by the first receiver 319, and then provides this data to logic circuitry (not shown) for use by that circuitry. In an illustrative embodiment, the latch 322 may operate to store data in response to the rising edge of the delayed clock signal, in accordance with the known "D-edge" latch convention.

Operation

Figure 4:
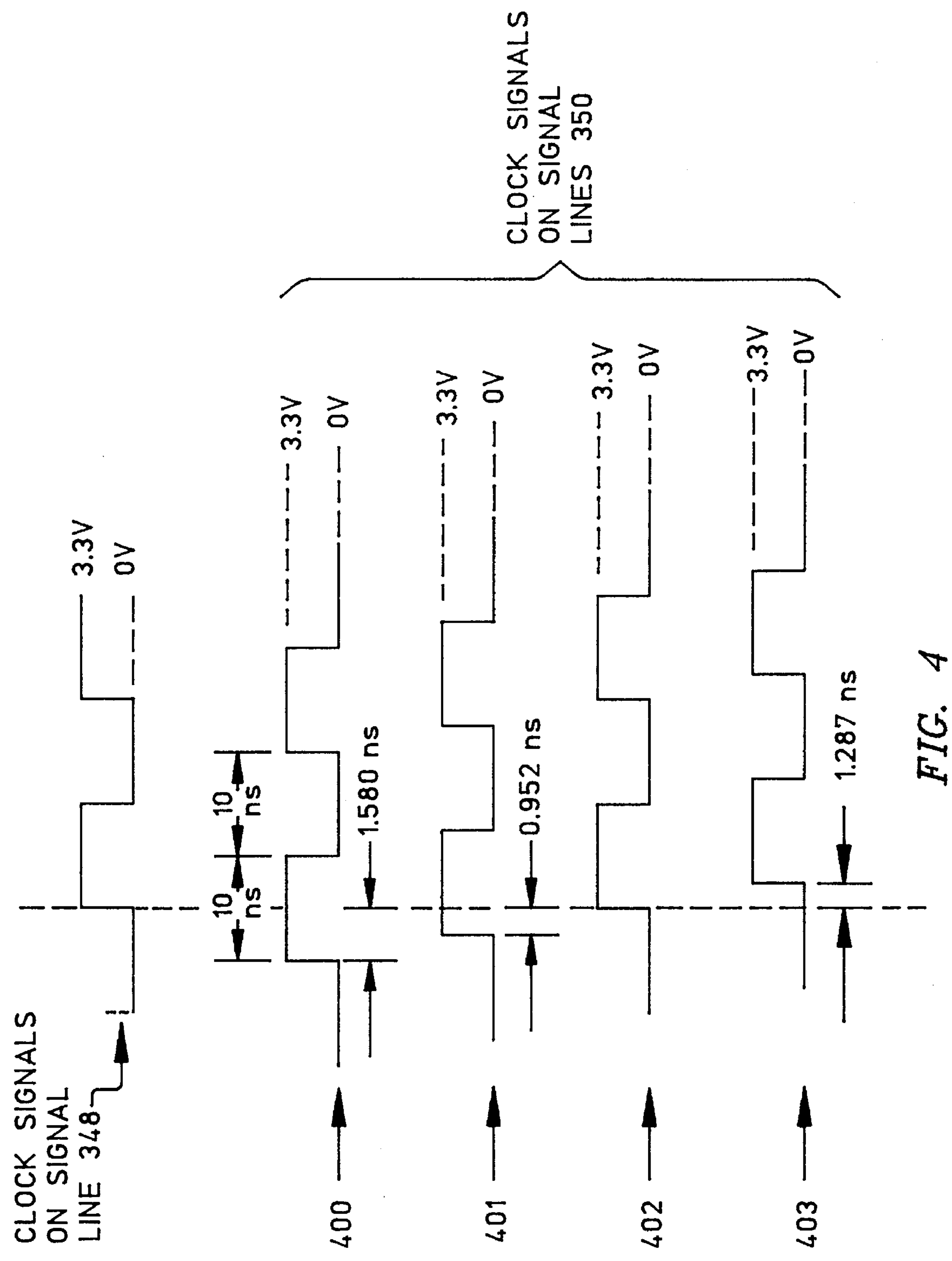
FIG. 4 is a diagram depicting clock signals provided by the sampling clock circuit 304, in accordance with the invention.

The memory controller 302 of the invention generally operates to coordinate the reading of data from the memory bank 300. The sampling clock circuit 304 continuously provides the sampling clock signals on the signal lines 350 to the clock selector 306. In the preferred embodiment, four clock signals are provided, as shown in FIG. 4. The clock signals preferably include a very early clock signal 400, an early clock signal 401, a nominal clock signal 402, and a late clock signal 403. Each of these clock signals is delayed by a different amount with respect to the system clock. Basically, the early clock signals 400–401 are appropriate when there is light memory loading and the late clock signal 403 is used when there is heavy memory loading. The nominal clock signal 402 is used for an intermediate level of loading. The invention also contemplates a greater number of clock signals if needed to achieve a wider range of clock signals or a more subtle gradient between clock signals.

In an illustrative embodiment, the system clock signal and the sampling clock signals 401–403 comprise square wave signals with a frequency of 50 MHz, having a duty of cycle of 50%. Thus, the system clock signal and the sampling clock signals 400–403 provide repeating 10 nS "on" periods, spaced apart by 10 nS "off" periods. In an illustrative embodiment of the invention, where the memory controller 302 is implemented in an ASIC, the clock signals rise to 3.3 volts during their "on" periods, and drop to 0 volts during their "off" periods. The predetermined delay of each sampling clock signal 400–403 with respect to the system clock signal is preferably selected based upon the expected levels of memory loading. With a wider variation of expected memory loading, the interval of delay between successive sampling clock signals 400–403 will be greater. In an exemplary embodiment, the rising edges of the sampling clock signals 400–403 are delayed, with respect to the system clock, by the following amounts:

1. clock signal 400: delay of −1.580 nS.
2. clock signal 401: delay of −0.952 nS.
3. clock signal 402: delay of 0 nS.
4. clock signal 403: delay of +1.287 nS.

Generally, the clock selector 306 selects one of these signals to forward to the delay module 313, to coordinate timing of data Read operations with the memory bank 300. More specifically, the mux driver 312 provides an output on the mux input lines 310, causing the mux 307 to output the correct sampling clock signal on the signal line 352. In an illustrative embodiment, the mux driver 312 provides its output based upon data received from a data source 305 via a selector bus 311, in the manner discussed below.

In some modern computing systems, such as the IBM S/390 mainframe computer, flash memory (not shown) is used to store detailed information concerning the memory components utilized by the system. ("S/390" is a trademark of IBM Corporation.) Such information, for example, may include the number of SIMMs present, the memory capacity of each SIMM, the type of memory components present, the type of I/O adapters, and other information called "vital product data." This data is usually written by a user to flash memory when initializing the computing system that hosts the memory. The flash memory typically comprises a write-once-read-many ("WORM") memory component such as an electrically programmable read only memory ("EPROM").

Where such flash memory is used, the data source 305 may comprise an off-chip processor (not shown), which reads the vital product data from the flash memory, and forwards a signal representing the level of memory loading to the mux driver 312 via the bus 311. The processor is called "off-chip" since it is preferably not contained on the ASIC of the memory controller 302. The processor preferably comprises a high-level processing unit, such as the type of processor that is typically employed manage memory controllers and other components of that level. When the memory controller 302 is used to manage DASDs of a mainframe computer, for example, the processor preferably comprises an Intel brand I-960 RISC processor. ("I-960" is a trademark of Intel Corporation.)

Alternatively, the data source 305 may comprise a set of mechanical switches set by the user, or an I/O port for receiving the user's selections, thus permitting the user to manually choose the clock signal fed from the signal lines 350. The mux driver 312 comprises circuitry for generating the appropriate electrical signals for the input lines 310, in response to the signal received from the selector bus 311. More particularly, the mux driver 312 includes circuitry for generating an appropriate output signal on the input lines 310 of the mux 307 to select the appropriate one of the sampling clock signals carried by the signal lines 350.

Whether the selection of one of the clock signals on signal lines 350 is made automatically or manually, it preferably accounts for the various factors which affect the skew of the data valid window with respect to the system clock. These factors include, for example, one or more of the following:

1. The number of memory modules 300*a*–300*d* being used and the number of memory circuits in each module;

2. The length of interconnecting signal lines between each memory module 300*a*–300*d* and the driver 308 and the system clock driver 301;

3. The capacitance of the connectors attaching the memory modules 300*a*–300*d* to the driver 308 and the system clock driver 304; and 4. The speed sort of the memory circuits in the memory modules 300*a*–300*d*.

With a larger data skew, for example, a clock signal on one of the signal lines 350 would be chosen to introduce a greater delay into the delay module 313. After the memory modules 300*a*–300*d* receive a Read command from the command bus 349, the memory modules 300*a*–300*d* place the requested data on the bus 320. In an exemplary embodiment of the invention, the clock selector 306 chooses the clock signal 402 as a default if no other clock signal 400–401 or 403 is selected.

The second clock driver 314 delays the selected sampling clock signal by an amount that is equal to the delay introduced into the system clock signal by the system clock driver 301; this occurs since the drivers 301 and 314 are made of identical components, and with identical chip processes. If an additional delay must be added to the delay of the driver 314 to coordinate the receipt of data from the memory bank 300, the supplementary delay unit 316 can be introduced. For example, by using a delay unit 316 comprising a six inch trace on a printed circuit board, a delay of about one nS of delay will be added.

Therefore, the delayed clock signal provided on the line 317 clocks the latch 322 at the appropriate time to receive data output by the memory bank 300 on the bus 320, during the data valid window. The latch 322 receives the delayed clock signal from the first receiver 319, and the Read data from the second receiver 318. Specifically, the receiver 318 forwards the Read data to the latch 322, at which time the receiver 319 forwards the delayed clock signal to properly latch data into the latch 322. In the illustrated embodiment, the latch 322 holds the data, in response to the rising edge of the delayed clock signal, making the data available for use by other logic circuitry.

While there have been shown what are presently considered to be preferred embodiments of the invention, it will be apparent to those skilled in the art that various changes and modifications can be made herein without departing from the scope of the invention as defined by the appended claims.

What is claimed is:

1. A memory controller for reading data from a memory bank containing an amount of synchronous random access memory including at least one memory module, the memory controller comprising:

a system clock driver connected to the memory bank to receive a system clock signal and provide a clock reference signal to the memory bank in response thereto, said clock reference signal having a frequency matching the system clock signal;

a command driver connected to the memory bank to receive Read command signals and initiate a Read operation in the memory bank by providing the Read command signals to the memory bank in accordance with timing provided by the system clock signal;

a sampling clock circuit to receive the system clock signal and duplicate the system clock signal to generate multiple sampling clock signals, each of said sampling clock signals exhibiting a different phase characteristic;

a clock selector having an output line, the clock selector connected to the sampling clock circuit to select one of the sampling clock signals in response to a signal indicating an amount of memory present in the memory bank, and to provide the selected sampling clock signal to the output line;

a delay module connected to the output line to provide a delayed clock signal comprising the selected clock signal delayed by a predetermined period of time; and a clocked latch electrically connected to the memory bank and the delay module, said clocked latch receiving the Read command signals, receiving Read data signals from the memory bank, and also receiving the delayed clock signal from the delay module, said clocked latch operating to latch said Read data signals in response to receipt of the Read command signals in accordance with timing provided by the delayed clock signal.

2. The memory controller of claim 1, wherein the command driver includes an inverter to invert the system clock signal such that the command driver provides the Read command signals to the memory bank in accordance with timing provided by the inverted system clock signal.

3. The memory controller of claim 1, wherein the clocked latch comprises a circuit to selectively latch the Read data signals in response to timing provided a rising edge of the delayed clock signal.

4. The memory controller of claim 1, wherein the clock selector comprises a multiplexer.

5. The memory controller of claim 1, wherein the delay module includes a second clock driver having a delay substantially equal to any delay of the system clock driver.

6. The memory controller of claim 5, wherein the delay module further includes a supplementary delay unit to add a predetermined delay to the delay provided by the second clock driver, wherein the supplementary delay unit is electrically connected in series with the second clock driver.

7. The memory controller of claim 6, wherein the supplementary delay unit comprises a fixed value delay circuit to provide a predetermined length of delay.

8. The memory controller of claim 6, wherein the supplementary delay unit comprises a predetermined length of signal line affixed to a printed circuit board.

9. The memory controller of claim 1, wherein the memory controller is contained on an application specific integrated circuit.

10. The memory controller of claim 9, wherein the delay module further includes a second clock driver having a delay substantially equal to any delay of the system clock driver, and a supplementary delay unit located externally to the application specific integrated circuit and electrically connected in series with the second clock driver.

11. The memory controller of claim 1, further comprising means for determining an amount of memory present in the memory bank and generating the signal indicating the amount of memory present in the memory bank.

12. A memory controller to read data from a memory bank that includes a specified number of synchronous random access memory modules, where said memory modules provide Read data during a data valid window occurring after a selected delay following receipt of Read command signals, said delay being dependent upon the number of memory modules present in the memory bank, said memory controller comprising:

a system clock driver connected to the memory bank to receive a system clock signal and provide a clock reference signal to the memory bank in response thereto, said clock reference signal having a frequency matching the system clock signal;

a command driver connected to the memory bank to receive Read command signals and initiate a Read operation in the memory bank for providing the Read command signals to the memory bank in accordance with timing provided by the system clock signal;

a clocked latch connected to the memory modules to receive Read data signals output by the memory bank and provide a latched output of said Read data signals, wherein said clocked latch is selectively activated in response to receipt of the Read command signals in accordance with timing provided by a timing signal received on a latch input line; and delay circuitry to generate a timing signal and provide the timing signal to the latch input line to activate the clocked latch during the data valid window.

13. The memory controller of claim 12, further comprising:

a first receiver connected between the clocked latch and the delay circuitry; and a second receiver connected between the clocked latch and the memory bank.

14. The memory controller of claim 12, wherein the delay circuitry includes a multiplexer to select a sampling clock signal among multiple sampling clock signals identical in frequency to the system clock signal, each sampling clock signal exhibiting a different phase characteristic, said selection being made in response to a signal indicative of the number of memory modules present in the memory bank.

15. The memory controller of claim 14, wherein the delay circuitry further comprises a delay module to introduce a selected delay to the selected signal.

16. The memory controller of claim 15, wherein the delay circuitry comprises a second clock driver providing a delay substantially equal to any delay of the system clock driver.

17. The memory controller of claim 14, further comprising means for determining the number of memory modules present in the memory bank and for generating the signal indicative of the number of memory modules present in the memory bank.

18. A method of reading data from a memory bank containing a number of synchronous random access memory modules, wherein said memory modules receive common Read command signals synchronized with a system clock and provide valid Read data during a data valid window occurring a selected delay after the Read command signals are received, said delay being dependent upon a level of memory loading exhibited by the memory bank, said method comprising the steps of:

generating multiple clock signals having a predetermined frequency, said clock signals including a system clock signal and multiple sampling clock signals, where each sampling clock signal exhibits a unique phase relationship with respect to the system clock signal;

providing the system clock signal to the memory bank via a system clock driver;

determining the level of memory loading;

in response to the determined level of memory loading, selecting an appropriate one of the sampling clock signals to clock a selectively activated latch during the data valid window of the memory bank;

providing Read command signals to the memory bank with a command driver in accordance with the timing provided by the system clock signal; and providing the Read command signals to the latch in accordance with the timing provided by selected sampling clock signal to activate the latch to receive Read data signals output by the memory modules during the data valid window.

19. The method of claim 18, wherein the Read commands are provided to the memory bank in accordance with timing provided by an inverse of the system clock signal.

20. The method of claim 18, wherein the step of determining comprises the steps of retrieving system data from a memory, said system data being indicative of the level of memory loading.

21. The method of claim 20, wherein the system data includes the number of memory modules present in the memory bank.

22. The method of claim 18, wherein the step of providing the Read command signals further comprises the steps of:

operating a second clock driver to provide a delayed output signal comprising the selected clock signal delayed by an amount equal to any delay introduced by the system clock driver in providing the system clock signal to the memory bank;

providing the delayed output signal to the latch to latch; and providing the Read command signals to the latch in accordance with timing provided by the delayed output signal.

23. The method of claim 22, further comprising steps of operating a supplementary delay unit to introduce a predetermined amount of additional delay into the delayed output signal.

* * * * *